(12) United States Patent
Barns

(10) Patent No.: US 7,294,931 B2
(45) Date of Patent: Nov. 13, 2007

(54) METHOD AND APPARATUS FOR SELECTIVE DEPOSITION

(75) Inventor: Chris Barns, Portland, OR (US)

(73) Assignee: Intel Corporation, Santa Clara, CA (US)

(*) Notice: Subject to any disclaimer, the term of this patent is extended or adjusted under 35 U.S.C. 154(b) by 101 days.

(21) Appl. No.: 11/011,324

(22) Filed: Dec. 13, 2004

(65) Prior Publication Data

US 2005/0153547 A1 Jul. 14, 2005

Related U.S. Application Data

(62) Division of application No. 10/404,775, filed on Mar. 31, 2003.

(51) Int. Cl.
*H01L 23/48* (2006.01)

(52) U.S. Cl. .................. 257/753; 257/750; 257/758

(58) Field of Classification Search ............... 257/762, 257/753, 750, 758

See application file for complete search history.

(56) References Cited

U.S. PATENT DOCUMENTS

| 5,354,593 | A | 10/1994 | Grandmont et al. |
| 5,736,424 | A | 4/1998 | Prybyla et al. |
| 6,511,912 | B1 | 1/2003 | Chopra et al. |
| 6,605,534 | B1 | 8/2003 | Chung et al. |
| 6,713,381 | B2 | 3/2004 | Barr et al. |
| 6,787,460 | B2 | 9/2004 | Lee et al. |
| 6,790,773 | B1 | 9/2004 | Drewery et al. |
| 2001/0055851 | A1 | 12/2001 | Horii |

FOREIGN PATENT DOCUMENTS

EP 0 984 485 A1 3/2000

OTHER PUBLICATIONS

Wolf, Stanley "Silicon Processing for the VSLI ERA" vol. 4, Deep Submicron Process Technology Lattice Press, Sunset Beach ca 2002, pp. 679-681.*
Wolf, Stanley "Silicon Processing For The VLSI Era" vol. 4, Deep—Submicron Process Technology, Lattice Press Sunset Beach, California Copyright 2002, p. 639.
Office Action from U.S. Appl. No. 10/404,775 mailed Nov. 8, 2006, 12 pgs.

* cited by examiner

*Primary Examiner*—Douglas M. Menz
(74) *Attorney, Agent, or Firm*—Blakely, Sokoloff, Taylor & Zafman LLP

(57) ABSTRACT

A method for selectively depositing a source material on a wafer is disclosed. In one embodiment, a wafer is having at least one recessed feature is provided. A top surface of the wafer is then coated with an inhibiting material. Finally, a source material is selectively deposited in the at least one recessed feature, the source material repelled by the inhibiting material. In another embodiment, the inhibiting material is one of a wax, a surfactant or an oil.

16 Claims, 8 Drawing Sheets

US 7,294,931 B2

METHOD AND APPARATUS FOR SELECTIVE DEPOSITION

This application is a divisional patent application claiming priority to parent application Ser. No. 10/404,775 titled "Method and Apparatus For Selective Deposition" filed Mar. 31, 2003 and is hereby incorporated by reference.

FIELD OF THE INVENTION

The present inventions relates to semiconductor fabrication. More specifically, the present invention relates to a selective deposition during a damascene process.

BACKGROUND

FIG. 1a illustrates a cross section of an integrated circuit (IC) employing multilevel metallization. A level of metallization contains electrical connections between elements in an IC. ICs can be manufactured having several layers of metallization to facilitate the increasing complexity and small size of microprocessors and other ICs.

An IC 100 has three layers of metallization 102, 104, and 106. The layers 102, 104, and 106 can be built on top of a single crystal silicon or other substrate 108. The substrate 108 can have semiconductor devices, such as transistors 110 and 112, formed in it. The layers 102, 104, and 106 can include conductive as well as insulating materials to isolate the conductive materials. The conductive materials, such as aluminum or copper, can form conductive lines connecting semiconductor devices such as the transistors 110 and 112, and can be separated and isolated by an insulating interlayer or interlevel dielectric (ILD) comprising a material such as silicon dioxide ($SiO_2$). ILDs 114, 116, and 118 isolate conductive lines from each other and prevent cross-talk and electrical shorts. The IC 100 has several conductive lines, including interconnects 120, 122, 124, 126, 128, 130, and 132, vias 134 and 136, and contacts 138 and 140. The ILDs 114, 116, and 118 can have recessed features such as trenches and vias. Trenches can allow for the interconnects 120–132, which can connect different regions of the IC. Vias 134 and 136 can create electrical connections between the interconnects 120–132, and the contacts 138 and 140 can create connections with the transistors 110 and 112.

A damascene process can create either a trench or a via. A dual damascene process can create both a trench and a via at the same time by creating a via within a trench. Prior processes for fabricating conductive lines might have involved depositing a conductive material over an entire surface and etching away the excess material. This is a subtractive process. The damascene and dual damascene processes create trenches and/or vias in an ILD first, and then deposit metal in the trenches and vias. Excess metal is then removed. These processes are additive rather than subtractive.

FIGS. 1b, 1c, and 1d illustrate a dual damascene process. In FIG. 1b, trenches and vias have been created in an ILD. A layer 150 may have an ILD 152 having several trenches 154, 156, 158, and 160. The ILD 152 may also be patterned to hold vias such as via 162. In FIG. 1c, metal has been deposited on the ILD 152. When a material is being deposited in a trench or via, the deposition process usually leaves excess material 168 on a top surface 170 of the ILD 152. The excess material is typically removed using a chemical mechanical polishing (CMP) process. The CMP process uses a chemical slurry and a rotating polishing pad to polish the top surface 170 of the ILD 152. The rotating polishing pad removes the excess metal material 168 and planarizes the top surface 170 of the ILD 152.

An ILD 152 having a high dielectric constant (k) may be undesirable in many applications because a high-k ILD can promote capacitive coupling between conductive lines. Reducing the resistance and capacitance experienced by interconnects can increase the propagation speed of the signals that travel through the interconnects. Resistance is reduced by using copper rather than aluminum as an interconnect metal, and capacitance can be reduced by using a low-k ILD. $SiO_2$ has a k of approximately 4.0. ILDs having a k of less than 4.0 are generally considered to be low-k.

Thus, in many ICs it may be desirable to use low-k ILDs in order to reduce capacitive coupling and propagation delay. One way to reduce the k of a material is to create pores or air pockets, because air has a very low k of approximately 1.0. However, low-k ILDs created in this way are mechanically weak. When CMP is performed on a low-k ILD, damage may occur to the ILD as a result of vibration and other mechanical forces and stresses caused by the rotating pad.

In FIG. 1d, material has been deposited in the trenches and vias and CMP has been performed to remove excess material. The deposition and subsequent CMP has created interconnects 172, 174, 176, and 178, and a via 180. The deposition of metal typically coats the up areas, or mesas, 170 with material, in addition to depositing material in the trenches 154, 156, 158, and 160. CMP can create various deformities in the ILD 152 such as a sheer induced via failure 182, a surface crack 184, subsurface delamination 186, and line-to-line "bent line" shorts. This damage can be caused by the stresses from mechanical polishing and the porosity of a low-K ILD 152. This physical damage can render an IC 100 useless, as it can cause electrical shorts and other problems.

DETAILED DESCRIPTION

Described herein is a method and apparatus for selective deposition. In the following description, numerous specific details are set forth. However, it is understood that embodiments may be practiced without these specific details. For example, well-known equivalent materials may be substituted in place of the described herein, and similarly, well-known equivalent techniques may be substituted in place of the particular semiconductor processing techniques disclosed. In other instances, well-known structures and techniques have not been shown in detail in order not to obscure the understanding of this description.

Described herein is a method and apparatus for selectively depositing conductive and other materials onto patterned wafers without using CMP. A wafer can begin as a single crystal silicon substrate and have semiconductor devices formed in the substrate and layers of metallization built up on the substrate to provide connections between the devices. The layers of metallization are built up on top of the substrate one layer at a time, beginning with a dielectric material to provide electrical isolation between conductive lines in the layers. After the dielectric material for a particular layer is deposited, recessed features, such as trenches and vias, are created in order to facilitate the creation of conductive lines through a dual damascene process. Once the recessed features are created, conductive material is deposited in the recessed features. Newer integrated circuits are using low-k dielectrics, which tend to be structurally weak. In a typical dual damascene process, the conductive material covers the entire dielectric, and must be removed using CMP, which can damage a low-k dielectric and cause shorts and other malfunctions. An inhibiting layer can be placed on the high areas of the dielectric before metal is deposited in order to prevent deposition of metal on the high areas of the dielectric, where it is not wanted. In this way, the CMP process is avoided.

Figure 2:
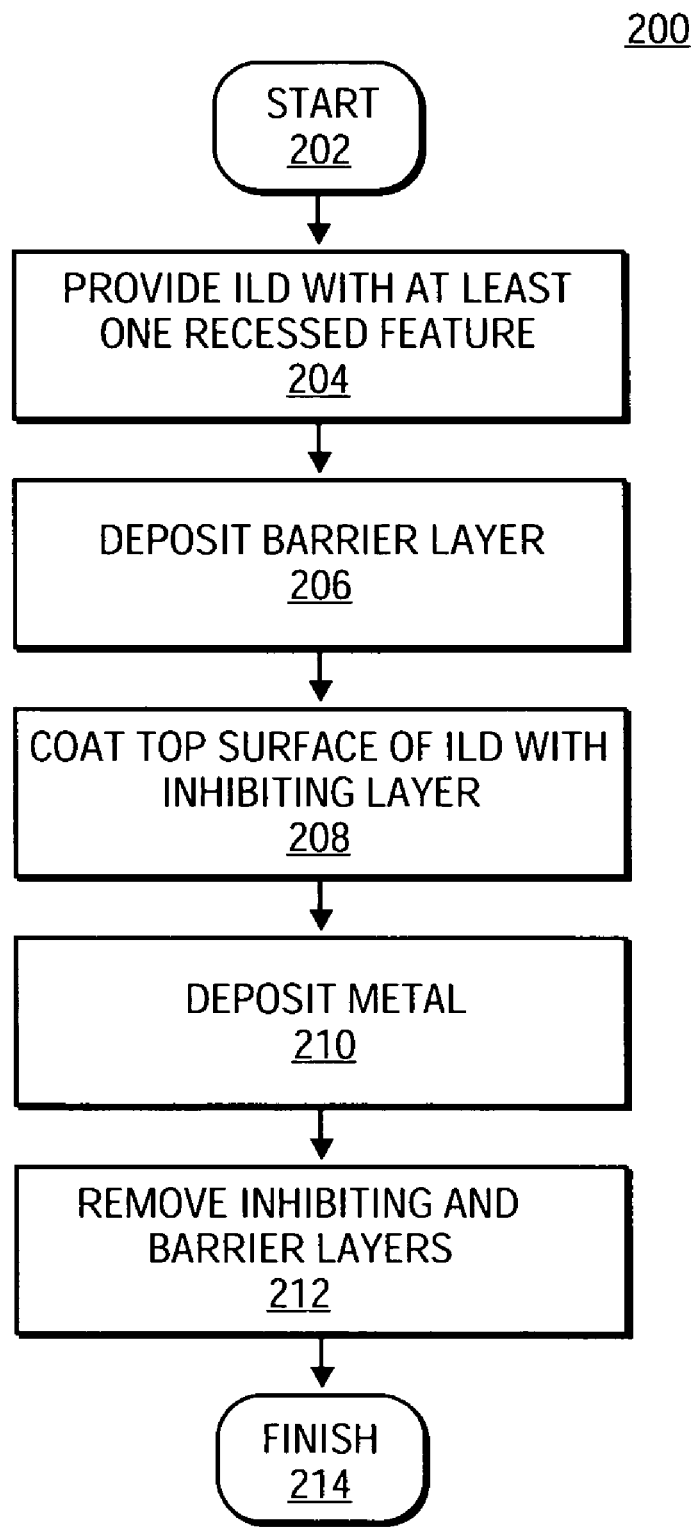
FIG. 2 is an embodiment of a process for selectively depositing a source material on an interlayer dielectric.
Figure 3A:
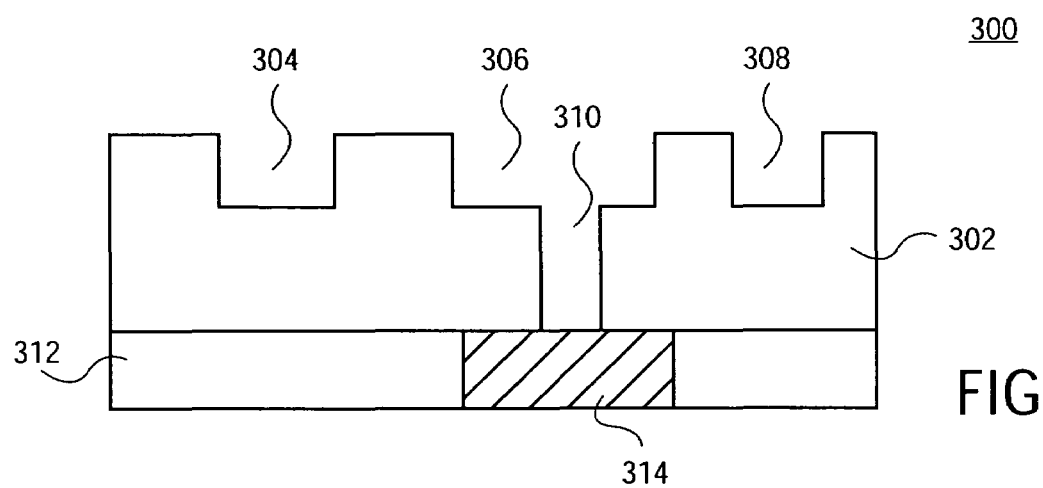
FIG. 3a illustrates a cross section of a patterned wafer according to one embodiment.

FIG. 2 is an embodiment of a process for selectively depositing a source material on an interlayer dielectric (ILD). The process 200 begins at block 202. At block 204 an ILD with at least one recessed feature is provided. FIG. 3a illustrates a cross section of a patterned wafer according to one embodiment. The IC 300 shown in FIGS. 3a–e is a small cross section of a larger patterned wafer, and the ILD 302 is the highest layer on that wafer. The IC 300 has an ILD 302 having damascene patterned trenches 304, 306, and 308, and a damascene patterned via 310. The term via refers to a structure for electrically connecting conductors in different interconnect or metallization layers. This term is sometimes used in the art to describe both an opening in an insulator in which the structure will be completed, and the completed structure itself. In the present disclosure, the term will be used to describe both the opening and the structure, and it will be clear from both the drawings and the description the meaning of the term as it is used in any particular instance. Further, in the present disclosure, the term conductive lines can include interconnects, vias, and contacts.

Figure 1A:
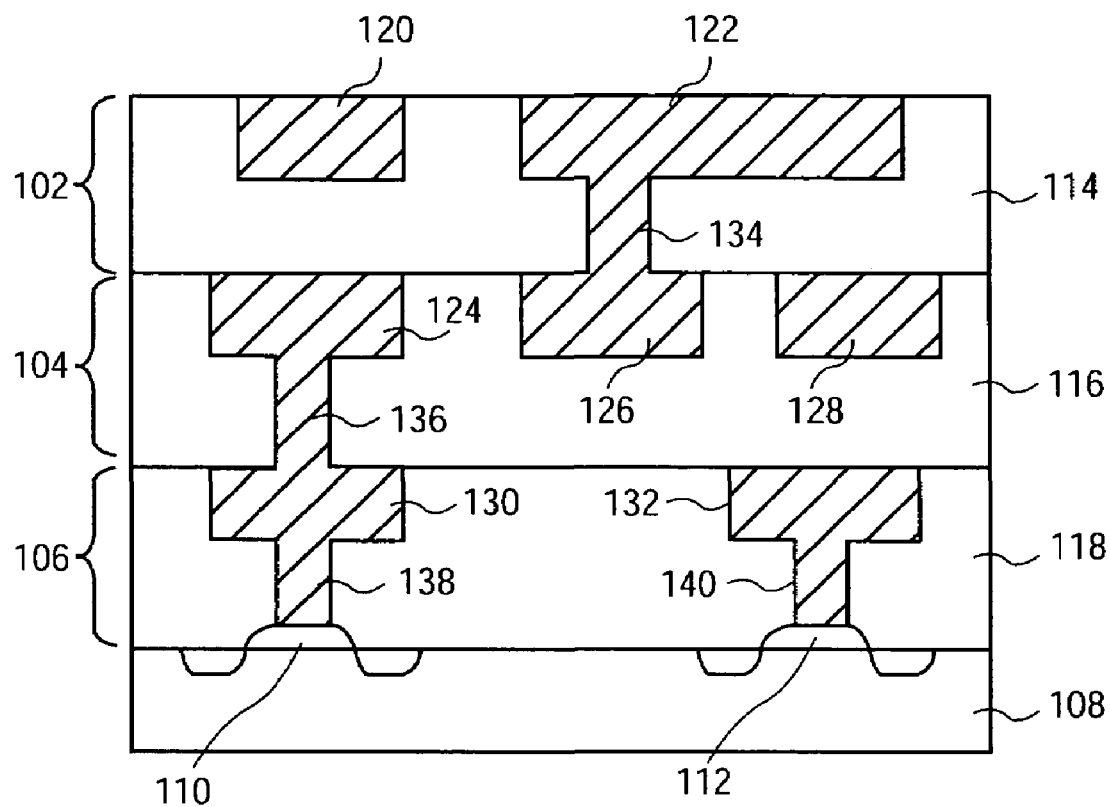
FIG. 1a illustrates a cross section of an integrated circuit employing multilevel metallization.
Figure 1B:
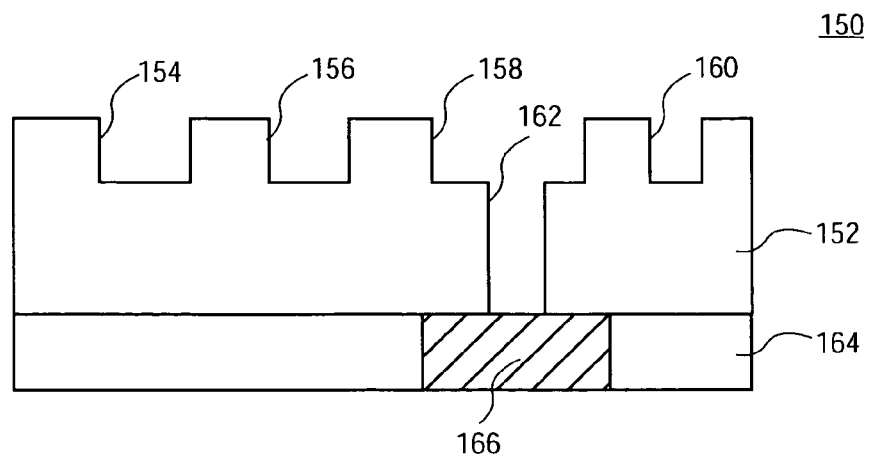
FIGS. 1b, 1c, and 1d illustrate a dual damascene process.
Figure 1C:
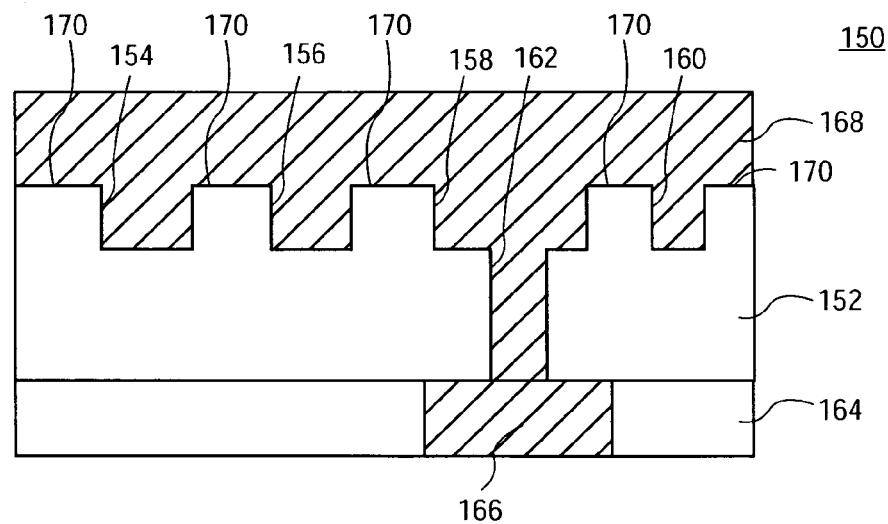
Figure 1D:
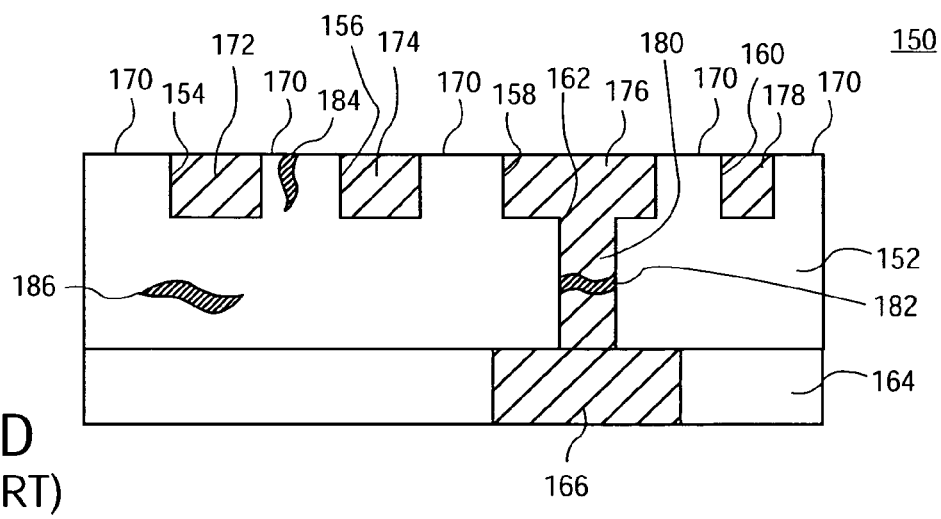

The trenches 304, 306, and 308, and the via 310 may generally be referred to as recessed features. The recessed features may be created through either a damascene or a dual damascene process. The wafer on which the IC 300 is fabricated may be, for example, a back end wafer used in back end of the line (BEOL) processing. The ILD 302 may comprise $SiO_2$, or a low-K dielectric such as a carbon doped oxide (CDO), fluorosilicate glass (FSG), fluorinated silicon dioxide, carbon based polymers, silicon based polymers, or SiLK™. As noted above, $SiO_2$ has a dielectric constant (k) of approximately 4.0. A low-k dielectric will have a k of less than 4.0, and is used in order to reduce capacitive coupling between conductive lines. Air has a k of approximately 1.0. Therefore, one way to decrease the k of a given ILD is to create pores or air pockets within the ILD material. These pores and air pockets, however, will create mechanical weaknesses in the structure of the material. If CMP is performed on a low-k ILD 302, physical damage such as illustrated in FIG. 1d can result. Therefore, if conductive lines can be created without using CMP, it will be much less likely that damage will occur to the ILD 302.

The ILD 302 is the top layer of an IC 300 utilizing multilayer metallization. The ILD 302 is formed on top of another ILD 312. The ILD 312 may also be a substrate in which semiconductor devices are formed. An interconnect 314 connects the conductive lines in the ILD 302 with the lower ILD 312. If the ILD 302 were part of the first layer built on a substrate, it is understood that the via 310 may also be a contact to form a connection with a semiconductor device formed in the substrate.

The trenches 304, 306, 308, and the via 310 are exemplary. It is understood that any other configuration of recessed features may be used. The ILD 302 is mounted upon another ILD 312, but it is clear that any configuration of layers may be used during the fabrication of an IC, and that the ILD 302 may be a first layer mounted directly upon a substrate. Further, the process 200 may be performed during formation of the ILD 312, or of any other ILD. In FIGS. 3a–3e, only the top ILD 302 and a portion of the ILD 312 are shown for simplicity.

Figure 3B:
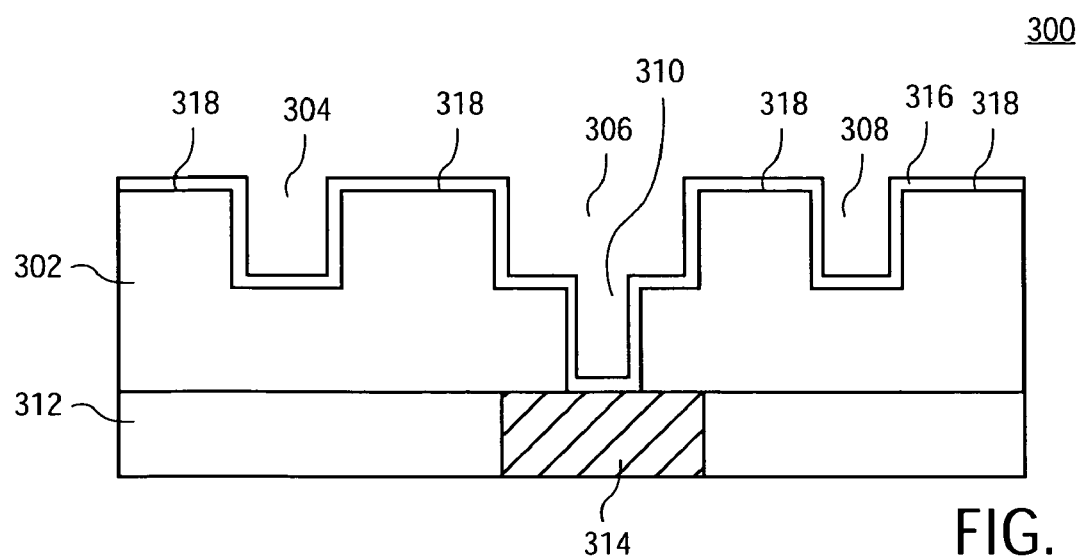
FIG. 3b illustrates a patterned interlayer dielectric having a barrier layer deposited on the interlayer dielectric.

At block 206, a conductive barrier layer 316 can be deposited on the ILD 302. Here, the top surface 318, as can be seen in the figures, refers to the topologically highest surface of the ILD 302 rather than the outer surface of the ILD 302. FIG. 3b illustrates a patterned ILD 302 having a barrier layer 316 deposited on the ILD 302. The barrier layer 316 can be deposited on the ILD 302 using one of several techniques that are well known, including chemical vapor deposition (CVD), physical vapor deposition (PVD), atomic layer deposition (ALD), etc. The barrier layer 316 can be conductive to provide a seed layer for an electroplating process. The barrier layer 316 can also be conformal and conform to the topography of the ILD 302. Further, the barrier layer 316 can provide protection to the ILD 302 from diffusion and electromigration caused by high electrical current densities and/or electrical fields. Copper in particular can contaminate ILDs because it is a rapid diffuser in silicon.

The barrier layer 316 can act as a seed layer to facilitate an electroplating process. The electroplating process generally requires a path through which an electrical current can travel. The wafer to be plated is dipped in a chemical bath containing a plating solution, and metal present in the plating solution adheres to any area where a seed layer has a current bias relative to the plating solution and is exposed to the plating solution. For example, if a wafer on which the IC 300 is located were electroplated, metal would adhere to exposed areas of the barrier layer 316 if a current were applied to the barrier layer 316 relative to the plating solution.

In one embodiment, it is not necessary to use a barrier layer 316, since, for example, an electroless plating process does not require a seed layer. An electroless plating process, instead, requires that the ILD 302 be chemically activated, for example by palladium (Pd). The wafer is then dipped in a chemical bath, and the plating solution adheres to the activated ILD. Further, a metal such as aluminum, which does not contaminate silicon as severely as copper, may be deposited instead of copper. Also, in some lower precision applications, the level of contamination created by the deposited material may be acceptable, thus obviating the need for a protective barrier layer 316.

Barrier layers 316 are typically comprised of tantalum (Ta) or tantalum nitride (TaN). However, both Ta and TaN can be difficult to remove. The etchants typically used to remove a Ta or TaN barrier layer can also cause damage to copper interconnects. In one embodiment, a ruthenium (Ru) barrier layer 316 is deposited. Ru can be easier to etch, and therefore may be more useful in many applications. This will be discussed further below.

Figure 3C:
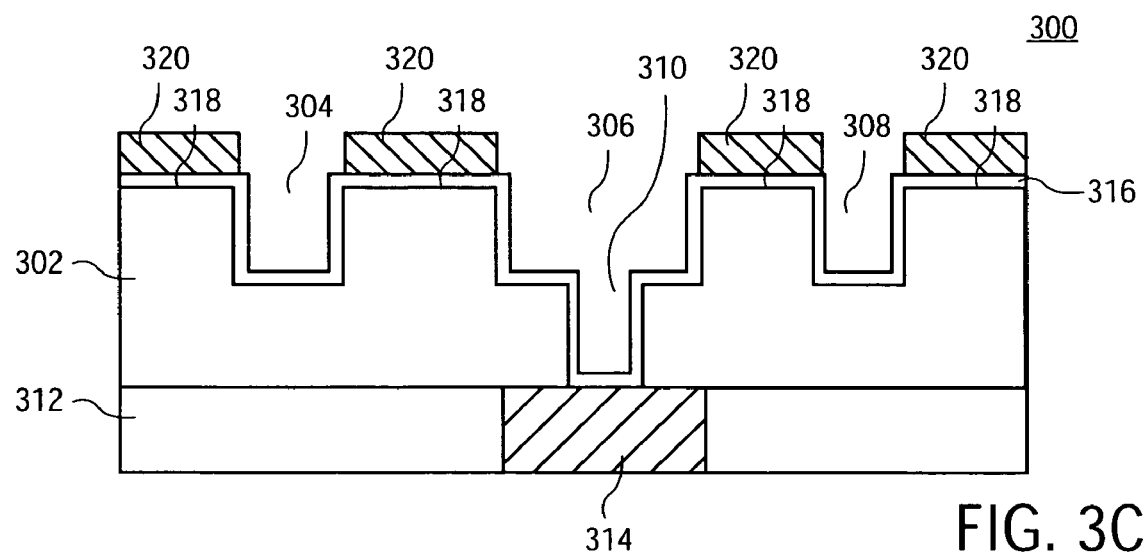
FIG. 3c illustrates an inhibiting layer deposited on a top surface of an interlayer dielectric.

At block 208, the top surface 318 of the ILD 302 is coated with an inhibiting layer 320. FIG. 3c illustrates an inhibiting layer 320 deposited on a top surface 318 of an ILD 302. The inhibiting layer 320 is applied to prevent a conductive or other source material, which will be deposited in the trenches 304, 306, and 308, from adhering to the surfaces on which the inhibiting layer 320 is applied. The inhibiting layer 320 may be, for example, a wax, a grease, an oil, or a surfactant. The inhibiting layer 320 may further contain fluorine, silicone, or polytetrafluoroethylene (PTFE), perfluoroalkylpolyether fluids including greases and oils (such as Krytox® by E.I. du Pont de Nemours and Company). The inhibiting layer 320 may further be a spray silicone oil such as Tri-Flow®. In one embodiment, the inhibiting layer 320 can be less than one micron thick. Aluminum is a typical metal used for conductive lines. Copper's lower resistivity can improve IC performance by allowing for smaller feature size and faster propagation speed. Therefore, copper has become the metal of choice for many IC applications, and to use copper in the process 200, those applications will need an inhibiting layer 320 capable of preventing the deposition of copper.

Since the trenches 304, 306, and 308, and the via 310 are to contain the deposited material, it is only upon the top surface or mesas 318 of the ILD 302 that the inhibiting layer 320 should be applied. Copper or other deposited source materials will not adhere to the inhibiting layer 320 during an electroplating process because the inhibiting layer is not conductive and will not allow the metal ions in the plating solution to contact the surface. Further, since the portion of the barrier layer 316 that is covered by the inhibiting layer 320 is not exposed to the plating solution, the material will be unable to adhere to that portion of the barrier layer 316. The electroplating process is designed to attract plating materials toward a certain surface, and if the surface, here the barrier layer 316, is covered, the metal or other material will not adhere. The source material will not adhere to the inhibiting layer 320 during an electroless plating process for similar reasons, because the inhibiting layer 320 will be chemically inert toward the plating solution. Therefore, the portions of the barrier layer 316 or the ILD 302 that are covered by the inhibiting layer 320 will remain free of the material that is deposited on the other surfaces of the barrier layer 316 or the ILD 302.

Because the deposited source material will not adhere to any part of the ILD 302 where the inhibiting layer 320 is deposited, and the recessed features of the ILD 302 are to contain the source material, care should be taken to insure that the inhibiting layer 320 does not descend into the trenches 304, 306, 308, and the via 312. The selection of the inhibiting material and the conditions under which the deposition processes will occur will determine whether and how much inhibiting material will enter the recessed features. This will be explained further below.

The inhibiting layer 320 may be applied using an application device such as a contact planarizer, a set of rollers, or another wafer. The application device may be a piece of glass, an optical flat made of fused silica, or a waxed table, for example. The selection of the application device and the time and pressure of application necessary may vary depending on the type of inhibiting layer 320 that will be used. In another embodiment, an inhibiting layer 320 may be applied to a wafer, and the inhibiting layer 320 on the application device may be patterned so as to imprint the pattern upon the wafer.

Figure 4:
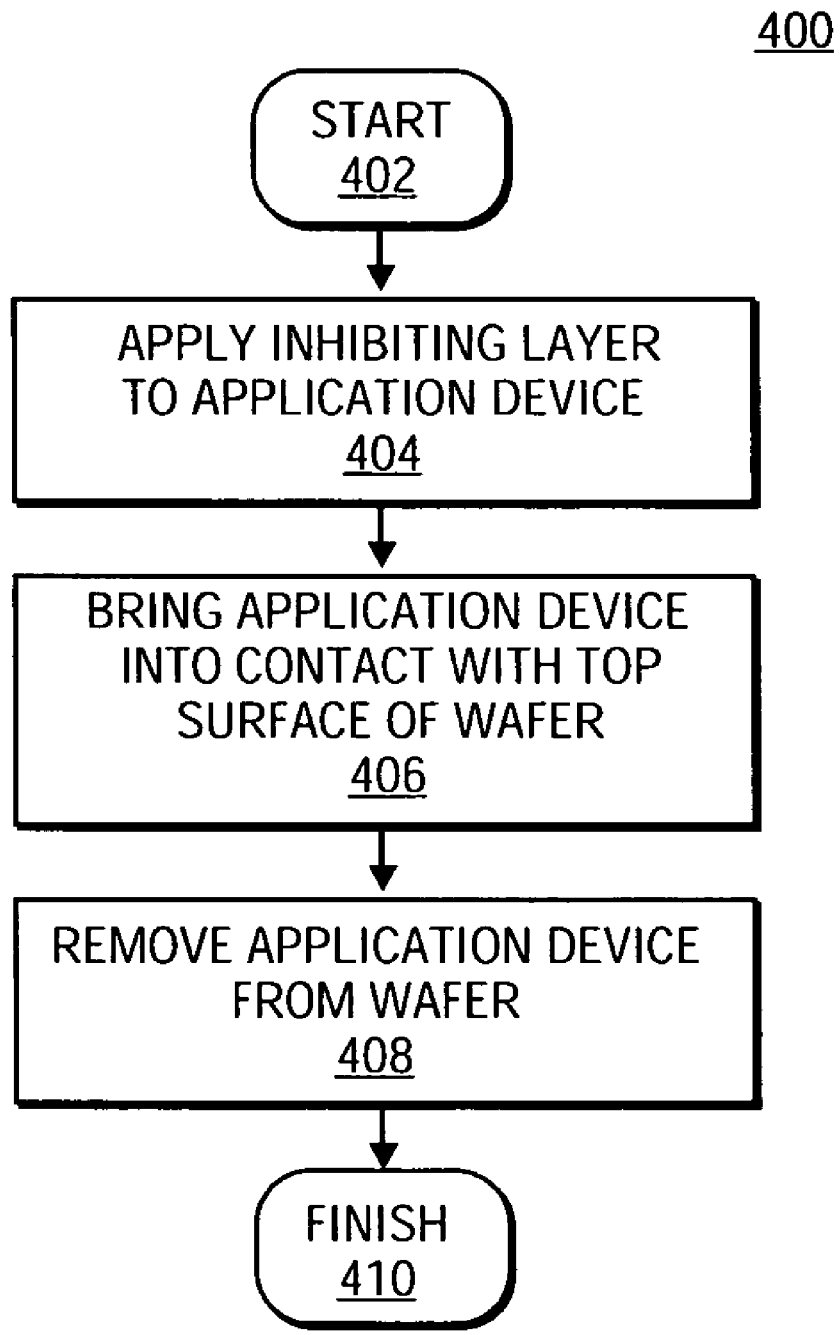
FIG. 4 is an embodiment of a process of applying an inhibiting layer to a wafer.
Figure 5A:
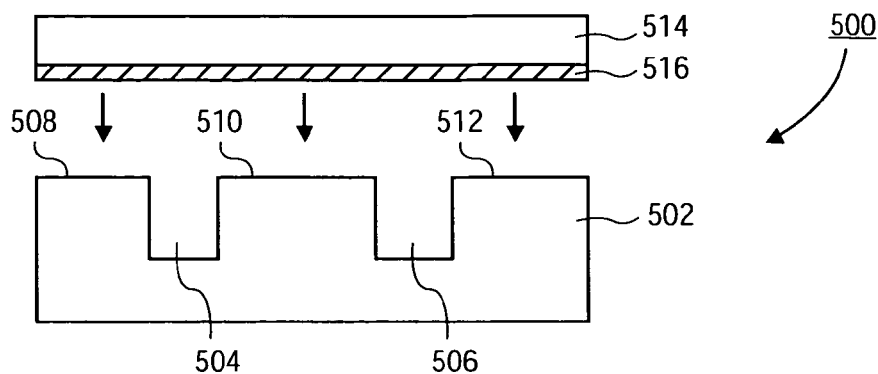
FIGS. 5a, 5b, and 5c illustrate the application of an inhibiting layer to a wafer.
Figure 5B:
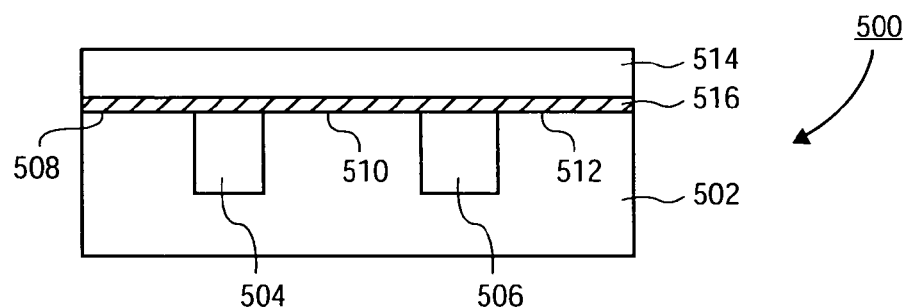
Figure 5C:
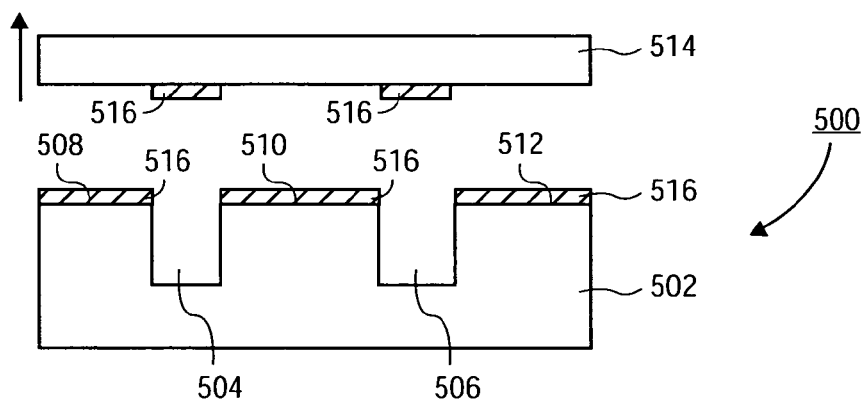

FIG. 4 is an embodiment of a process of applying an inhibiting layer to a wafer. FIGS. 5a, 5b, and 5c illustrate the application of an inhibiting layer to a wafer. FIGS. 5a, 5b, and 5c illustrate the application of an inhibiting layer using, for example, a flat plate of glass or a featureless wafer. However, as noted above, other application devices, such as a set of rollers, can be used. FIGS. 5a, 5b, and 5c show a wafer 500 and an application device 514. It is understood, however, that the wafer 500 as shown may only be a small portion of a much larger wafer, and that the application device 514 as shown may only be a small portion of a much larger application device. Further, although only one layer represented by an ILD 502 is shown, it is understood that the wafer 500 may contain several other layers which are not shown.

The process 400 starts at block 402. At block 404, an inhibiting layer is applied to an application device. FIG. 5a illustrates an application device having an inhibiting layer applied to it being brought toward a patterned wafer. A wafer 500 has an ILD 502 having recessed features 504 and 506, and mesas 508, 510, and 512. An application device 514 has applied to it an inhibiting layer 516. As noted above, the application device 514 can be a flat plane of glass, a featureless wafer, a contact planarizer, a pair of rollers, etc. Methods for applying the inhibiting layer 516 to the application device 514 will depend on the material used for the inhibiting layer 516. One possible application method is to use spin-on deposition. Other possible application techniques include applying the inhibiting layer 516 to the application device 514 with a set of rollers, a squeeze tube, a spray, or a brush, and then planarizing the inhibiting layer 516 by polishing or spinning. Another method is to spray or spin on a liquid layer and to allow surface tension and evaporation to create a thin planar layer. As will be discussed with regards to FIG. 5d, the inhibiting layer 516 will have to be relatively planar so that the inhibiting layer 516 is applied only to the mesas 508, 510, and 512. In another embodiment, a patterned inhibiting layer 516 can be applied to a wafer using the application device 514. The inhibiting layer 516 can be patterned using various well known techniques. The patterned inhibiting layer 516 can then be applied to and transferred to the wafer. Metal can then be deposited on the wafer, creating conductive lines or other structures on the portion of the wafer where the inhibiting material is not deposited.

In one embodiment, the mesas 508, 510 and 512, as well as the surface of the application device 514, must be very clean and very flat before the inhibiting layer 516 can be applied, in order for the inhibiting layer 516 to adhere properly. The application device 514 must also be very flat relative to the wafer 500 and relative to the size of the recessed features 504 and 506. For example, if the application device 514 were to be flexible in relation to the ILD 502 and its recessed features 504 and 506, then the inhibiting layer 516 could inadvertently be applied to the interior walls of the trenches 504 and 506. The application device 514 must be stiff enough locally to bridge across the recessed features 504 and 506 in order to prevent this. If the any portion of the inhibiting layer 516 is applied to the insides of the trenches 504 and 506, it is possible that portions of the trenches 504 and 506 will not be filled with the deposited source material, and that the conductive lines will be incomplete. Therefore, care must be taken to insure that the inhibiting layer 516 is thin enough and viscous enough to avoid descending into the trenches 504 and 506.

At block 406, the application device 514 is brought into contact with the wafer 500. This is illustrated in FIG. 5b. In FIG. 5b the application device 514 is lowered so that the inhibiting layer 516 comes into contact with the mesas 508, 510, and 512. In another embodiment, the wafer 500 can be raised toward the application device 514 in order to transfer the inhibiting layer 514. The surface topography of the wafer 500 will effectively pattern the inhibiting layer 516 and transfer the portion of the inhibiting layer 516 that is in contact with the mesas 508, 510, and 512 to the mesas 508, 510, and 512. In one embodiment, a film is applied to the application device 514 in order to form an inhibiting layer 516. The wafer 500 and the application device 514 are then brought together and a specific pressure is applied to the system over a specific amount of time in order to ensure the proper transfer of the inhibiting layer 516.

The material comprising the inhibiting layer 516 must be viscous so that the inhibiting material does not get squeezed laterally and run into the trenches 504 and 506. Further, the inhibiting layer 516 must be viscous enough to avoid deformation during the deposition process. A typical oil, grease, wax, or surfactant (containing fluorine, silicone, or polytetrafluoroethylene (PTFE)) may have a viscosity of between 100 and 500,000 centipoise (cP). The viscosity of any given material will also decrease as its temperature increases. In one embodiment, a high viscosity of greater than 50,000 cP will be necessary. However, the conditions under which the IC is being fabricated will dictate the choice of inhibiting material. For example, a process using lower temperatures can use a relatively less viscous inhibiting material. The inhibiting layer 516 must also be adhesive enough so that it adheres sufficiently to the mesas 508, 510, and 512.

At block 408, the application device 514 is removed from the wafer 500. This is illustrated in FIG. 5c. The application device 514 is lifted up and away from the wafer 500, and the portion of the inhibiting layer 516 that makes contact with the mesas 508, 510, and 512 adheres to the mesas 508, 510, and 512, and the remaining portion remains attached to the application device 514. The inhibiting layer 516 has therefore been patterned by the topography of the wafer 500. When the application device 514 is being brought into contact with the wafer 500 in block 406, sufficient pressure must be applied to the application device 514 so that the inhibiting layer 516 will adhere to the mesas 508, 510, and 512. The adhesion force of the inhibiting layer 516 must be strong enough so that the inhibiting layer 516 will remain on the mesas 508, 510, and 512 when the application device 514 is removed.

Using this method, the inhibiting material remains only on the mesas 508, 510, and 512 and does not descend into the recessed features 504 and 506. Because the inhibiting layer 516 is only applied to the mesas 508, 510, and 512, it will prevent the source material that is to only be deposited into the recessed features 504 and 506 from being deposited on the mesas 508, 510, and 512. Therefore, once the source material is deposited, CMP will not have to be performed to remove excess metal or material, and even if the ILD 502 is a low-k ILD, there is a much smaller risk of damage to the ILD 502.

Figure 5D:
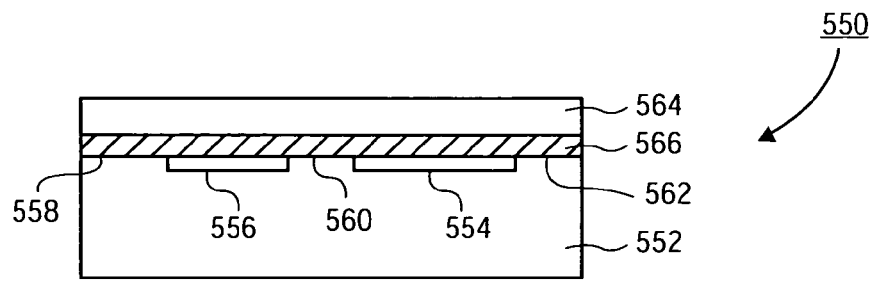
FIG. 5d illustrates the application of an inhibiting layer to a wafer having shallow recessed features.

FIG. 5d illustrates the application of an inhibiting layer to a wafer having shallow recessed features. A wafer 550 has an ILD 552 having two trenches 554 and 556. As above, the wafer 550 as shown can be a small portion of a much larger wafer. The ILD 552 also has mesas 558, 560, and 562. An application device 564 has applied to it an inhibiting layer 566, which has been brought into contact with the ILD 552. As can be seen in FIG. 5d, the trenches 554 and 556 are very shallow when compared to the thickness of the inhibiting layer 566. When the inhibiting layer 566 is relatively thick in comparison to the recessed features of the ILD 552, it can be very difficult to apply the inhibiting layer 566 to the mesas 558, 560, and 562 without applying any of the inhibiting layer 566 to the bottoms of the trenches 554 and 556. Therefore, an inhibiting layer 566 of appropriate thickness should be used. In some applications, where feature size is small and trenches are shallow, the inhibiting layer 566 may have to be as thin or thinner than one micron in order to prevent application of the inhibiting layer 566 to the interiors of the trenches 554 and 556.

Figure 3D:
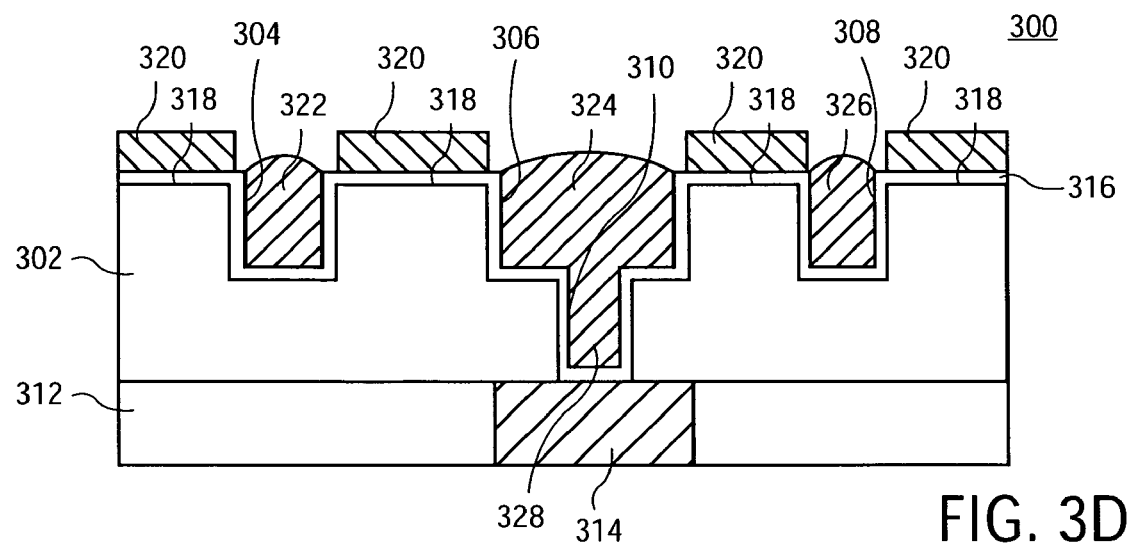
FIG. 3d illustrates a patterned interlayer dielectric having an applied inhibiting material and a deposited source material.

Returning to the process 200, in block 210 the metal or other source material is deposited in the trenches 304, 306, and 308. FIG. 3d illustrates a patterned ILD 302 having an applied inhibiting material and a deposited source material. The copper or other source material can be deposited in trenches 304, 306, and 308 using an electroplating or electroless plating process, depending on the needs of the application. A "superfill" process, which can control the level of metal deposited in the recessed features, can also be used. With the superfill process, it may be easier to ensure that the recessed features are not overfilled.

The source material can be copper, aluminum, silver, ruthenium, tantalum, solder, tinning, polysilicon, or any other conductive material. The deposited source material creates interconnects 322, 324, 326, and a via 328. The interconnects 322, 324, and 326 are shown having an overfill, which may develop during deposition. However, this overfill should not create any electrical shorts in the IC 300 because layers deposited on top will isolate the interconnects 322, 324, and 326. In some instances, the overfill or an underfill may create a topography which can be planarized using a planarization layer or CMP on a higher ILD level.

As can be seen in FIG. 3d, the trenches 304, 306, and 308 are now filled with the copper or other source material. As can also be seen there is no copper or other source material on the mesas or top surfaces 318 of the ILD 302, as the copper or other source material was unable to be deposited on the surfaces coated by the inhibiting layer 320. The inhibiting layer 320 has prevented the deposition of a source material on the top surface of an ILD. Therefore, the copper or other source material has been selectively deposited only where it is desired, in this case in the trenches 304, 306, and 308. It should be noted that in some instances the inhibiting layer 320 may not completely cover the top surface 318, and that small amounts of source material may deposit on the top surface 318. However, the inhibiting layer 320 will generally prevent most, if not all source material from depositing on the top surface 318.

At block 212, the inhibiting layer 320 and barrier layer 316 are removed. It is understood that the portion of the barrier layer 316 that is to be removed is the portion that is covering the top surface 318. The portion of the barrier layer that is lining the trenches 304, 306, and 308 cannot be removed because it is covered by the interconnects 322, 324, and 326, and the via 328. Further, the barrier layer 316 should not be removed where it is found in the recessed features because the barrier layer is to act as a diffusion layer. Therefore, only the exposed barrier layer 316 will be removed. This will be shown in FIG. 3e.

It should be noted that if an electroless plating process were used to deposit the source material, and there is no barrier layer 316, then removing the inhibiting layer 320 is an optional operation, and that in some applications it may be necessary or desirable to leave the inhibiting layer 320 intact and to continue adding layers without removing the inhibiting layer 320. If there is a barrier layer 316 to be removed, and the barrier layer 316 comprises Ru, a Periodic acid solution can etch away the Ru barrier layer 316 without affecting the interconnects 322, 324, and 326. Further, Ta and TaN barrier layers can be difficult to remove because the processes used to etch these materials typically require many time and temperature sensitive steps. By using a Ru barrier layer 316, the source material deposited in the trenches will not be affected when the barrier layer 316 is removed. However, a barrier layer 316 will have to be selected based on the needs and requirements of the application, and in some cases it may be necessary or desirable to use a Ta or TaN barrier layer.

If the inhibiting layer 320 comprises a perfluoropolyether (PFPE) oil or grease, or perfluorocarbon (PFC) fluids, then the inhibiting layer 320 can be easily removed without disturbing the ILD 302 or its components by washing the wafer in trichlorotrifluoroethane (Freon TF®), Perfluorosolv® PFS-2 by Solvay Solexis, or similar compounds. The inhibiting layer 320 may also be removed through a mechanical process such as polishing or scrubbing. If a polishing process is used, any damage to the ILD 302 should be minimal, however, since much less force would be required to remove the relatively soft inhibiting layer 320 than would be required to remove excess metal. However, as noted above, it can also be desirable in some applications to leave the inhibiting layer 320 on the ILD 302 and to continue adding layers on top.

Figure 3E:
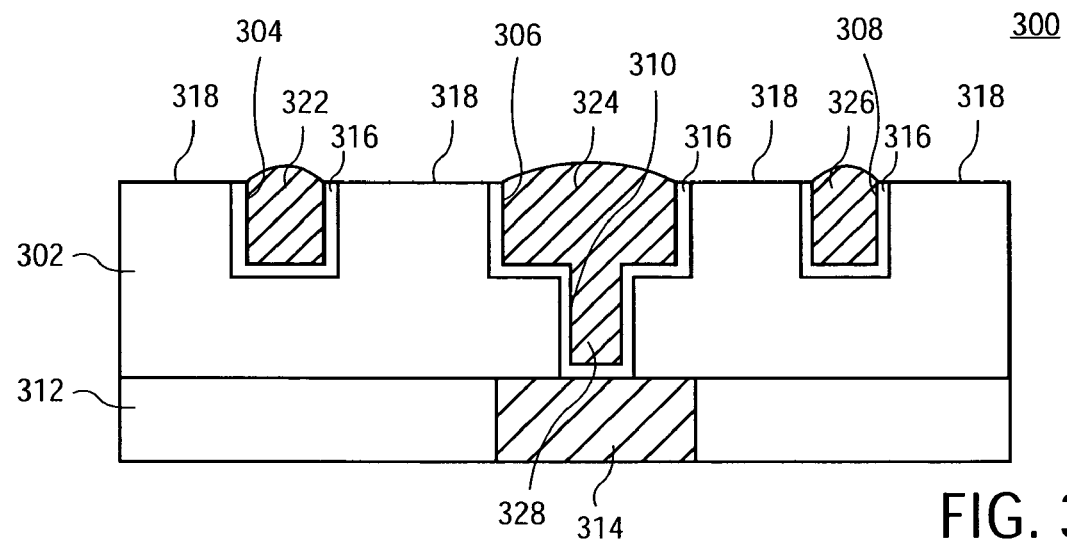
FIG. 3e illustrates a completed selective deposition on an interlayer dielectric.

FIG. 3e illustrates a completed selective deposition on an ILD. As can be seen, the source material has been selectively deposited in the trenches 304, 306 and 308 and not on the top surface 318 of the ILD 302 without using CMP or other mechanical processes that can damage the ILD 302. In one embodiment, the top surface 318 of the ILD 302 can now be capped with an electroless cobalt or ruthenium deposition process. Also, new layers, such as further metallization layers, can be added on top of the ILD 302, or the processing of the IC 300 can be completed. If new layers are added, CMP can be used on a higher level layer if desired or needed to reduce surface topography without having a significant impact on the ILD 302.

This method of application is advantageous because the copper or other source material will not be deposited on the areas covered by the inhibiting layer. This is because the inhibiting layer can be chosen so that the copper or other source material does not adhere to the inhibiting layer. As a result, CMP or other processes are not required remove excess copper or other source materials from the mesas or top surface of the ILDs 302 or 502. Because there is no excess material which needs to be removed, the ILDs 302 or 502 are less likely to suffer damage during manufacturing. This may become especially important because of newer low-k dielectrics which are more porous than conventional ILDs and have other structural weaknesses. Further, the method may prove to be less expensive than the CMP process because it is less complicated and uses common materials.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A semiconductor structure comprising:
   an ILD layer formed above a substrate, wherein said ILD layer has a top surface;
   a trench formed in said ILD layer, wherein said trench has a bottom surface and a sidewall surface;
   a seed layer formed above said top surface of said ILD layer and above said bottom surface and said sidewall surface of said trench, wherein said seed layer consists of a seed material;
   an inhibiting layer formed above the portion of said seed layer that is above said top surface of said ILD layer, but not above the portion of said seed layer that is above said bottom surface and said sidewall surface of said trench, wherein said inhibiting layer does not comprise said seed material, and wherein said inhibiting layer is comprised of a material selected from the group consisting of a wax, a grease, an oil or a surfactant; and
   a metal layer formed above the portion of said seed layer that is above said bottom surface and said sidewall surface of said trench, but not above the portion of said seed layer that is above said top surface of said ILD layer and not above said inhibiting layer.

2. The structure of claim 1, wherein said ILD layer is comprised of a material selected from the group consisting of $SiO_2$, carbon doped oxide, fluorosilicate glass, fluorinated silicon dioxide, carbon based polymers, silicon based polymers or SILK™.

3. The structure of claim 1, wherein said seed layer comprises a conductive barrier layer.

4. The structure of claim 3, wherein said conductive barrier layer is comprised of a material selected from the group consisting of palladium, tantalum, tantalum nitride or ruthenium.

5. The structure of claim 1, wherein said inhibiting layer is comprised of a material selected from the group consisting of fluorine, silicone, polytetrafluoroethylene or a perfluoroalkylpolyether fluid.

6. The structure of claim 5, wherein said inhibiting layer has a thickness of less than 1 micron.

7. The structure of claim 6, wherein said inhibiting layer has a viscosity between 100 and 500,000 centipoise.

8. The structure of claim 1, wherein said metal layer is comprised of a material selected from the group consisting of copper, aluminum, silver, ruthenium or tantalum.

9. A semiconductor structure comprising:
   an ILD layer formed above a substrate, wherein said ILD layer has a top surface;
   a trench formed in said ILD layer, wherein said trench has a bottom surface and a sidewall surface;
   a seed layer formed directly on said top surface of said ILD layer and directly on said bottom surface and said sidewall surface of said trench, wherein said seed layer consists of a seed material;
   an inhibiting layer formed directly on the portion of said seed layer that is directly on said top surface of said ILD layer, but not on the portion of said seed layer that is directly on said bottom surface and said sidewall surface of said trench, wherein said inhibiting layer does not comprise said seed material, and wherein said inhibiting layer is comprised of a material selected from the group consisting of a wax, grease, an oil or a sufactant; and a metal layer directly on the portion of said seed layer that is directly on said bottom surface and said sidewall surface of said trench, but not on the portion of said seed layer that is directly on said top surface of said ILD layer and not above said inhibiting layer.

10. The structure of claim 9, wherein said ILD layer is comprised of a material selected from the group consisting of $SiO_2$, carbon doped oxide, fluorosilicate glass, fluorinated silicon dioxide, carbon based polymers, silicon based polymers or SILK™.

11. The structure of claim 9, wherein said seed layer comprises a conductive barrier layer.

12. The structure of claim 11, wherein said conductive barrier layer is comprised of a material selected from the group consisting of palladium, tantalum, tantalum nitride or ruthenium.

13. The structure of claim 9, wherein said inhibiting layer is comprised of a material selected from the group consisting of a wax, a grease, an oil or a surfactant.

14. The structure of claim 13, wherein said inhibiting layer has a thickness of less than 1 micron.

15. The structure of claim 14, wherein said inhibiting layer has a viscosity between 100 and 500,000 centipoise.

16. The structure of claim 9, wherein said metal layer is comprised of a material selected from the group consisting of copper, aluminum, silver, ruthenium or tantalum.

* * * * *

UNITED STATES PATENT AND TRADEMARK OFFICE
CERTIFICATE OF CORRECTION

PATENT NO. : 7,294,931 B2
APPLICATION NO. : 11/011324
DATED : November 13, 2007
INVENTOR(S) : Barns It is certified that error appears in the above-identified patent and that said Letters Patent is hereby corrected as shown below:

Column 12, at line 3, delete "The structure of claim 9, wherein said inhibiting layer is comprised of a material selected from the group consisting of a wax, a grease, an oil or a surfactant." and insert --The structure of claim 9, wherein said inhibiting layer is comprised of a material selected from the group consisting of fluorine, silicone, polytetrafluoroethylene or a perfluoroalkylpolyether fluid.--.

Signed and Sealed this

Twenty-fifth Day of March, 2008

JON W. DUDAS
*Director of the United States Patent and Trademark Office*